United States Patent [19]

Yeh et al.

[11] Patent Number: 5,661,051
[45] Date of Patent: Aug. 26, 1997

US005661051A

[54] METHOD FOR FABRICATING A POLYSILICON TRANSISTOR HAVING A BURIED-GATE STRUCTURE

[75] Inventors: Ching-Fa Yeh; Jyh-Nan Jeng, both of Hsinchu, Taiwan

[73] Assignee: National Science Council, Taipei, Taiwan

[21] Appl. No.: 728,495

[22] Filed: Oct. 9, 1996

[51] Int. Cl.$^6$ .................................................. H01L 21/265
[52] U.S. Cl. ............................................. 438/158; 438/787
[58] Field of Search ........................... 437/21, 40, 41

[56] References Cited

U.S. PATENT DOCUMENTS

| | | | |
|---|---|---|---|
| 4,381,202 | 4/1983 | Mori et al. | 437/41 |
| 4,746,377 | 5/1988 | Kobayashi et al. | 437/40 |
| 5,120,666 | 6/1992 | Gotou | 437/40 |
| 5,188,973 | 2/1993 | Omura et al. | 437/40 |
| 5,401,685 | 3/1995 | Ha | 437/40 |
| 5,426,062 | 6/1995 | Hwang | 437/21 |
| 5,510,278 | 4/1996 | Nguyen et al. | 437/21 |
| 5,580,802 | 12/1996 | Mayer et al. | 437/41 |

FOREIGN PATENT DOCUMENTS

| | | |
|---|---|---|
| 61-13662 | 1/1986 | Japan . |
| 4-324938 | 11/1992 | Japan . |

OTHER PUBLICATIONS

Li-Rou Shiu, Chun-Lin Chen and Ching-Fa Yeh, "Novel Silicon Dielectric Selectively Deposited on Silicon Substrate," 1995 Annual Conference of the Chinese Society for Material Science, pp. 276–277, Apr. 21–22, 1995.

C.F. Yeh, C.L.Chen and G.H. Lin, "The Physicochemical Properties and Growth Mechanism of Oxide ($SiO_{2-x}F_x$) by Liquid Phase Deposition with $H_2O$ Addition Only," J. Electrochem. Soc., vol. 141, No. 11, 3177 (1994). Month Unknown.

James R. Pfiester et al., "A Novel PMOS SOI Polysilicon Transistor," IEEE Electron Device Letters, vol. 11, No. 8, Aug. 1990, pp. 349–351.

Primary Examiner—John Niebling
Assistant Examiner—Michael S. Lebentritt
Attorney, Agent, or Firm—Hitt Chwang & Gaines P.C.

[57] ABSTRACT

A polysilicon transistor having a buried-gate structure is fabricated by a method involving a liquid phase deposition which is used for depositing selectively a silicon dioxide layer on a polysilicon layer, but not on a photoresist layer. The silicon dioxide liquid phase deposition is brought about by using an aqueous hydrofluorosilicic acid ($H_2SiF_6$) solution supersaturated with silicon dioxide. Upon completion of the stripping of the photoresist layer, the selectively-deposited silicon dioxide layer is used as a mask to perform the source/drain ion implant.

5 Claims, 2 Drawing Sheets

METHOD FOR FABRICATING A POLYSILICON TRANSISTOR HAVING A BURIED-GATE STRUCTURE

FIELD OF THE INVENTION

The present invention relates generally to a method for fabricating a polysilicon transistor, and more particularly to a method for making a polysilicon transistor having a buried-gate structure.

BACKGROUND OF THE INVENTION

The employment of a P-type polysilicon thin film transistor for the active load in the static random access memory (SRAM) can bring about several advantages, which include the lower standby current, the improved cell stability and the higher soft-error immunity. A typical polysilicon thin film transistor comprises two opposite polysilicon layers separated by a gate oxide layer which is formed by the oxidation of the bottom layers of the two opposite polysilicon layers. The film quality of the silicon dioxide layer formed by the oxidation of the polysilicon is much inferior to the film quality of the silicon dioxide layer which is formed by the oxidation of the single-crystalline silicon substrate. With a view to overcoming such a quality problem as described above, James R. Pfiester, et al. in their article, entitled "A Novel PMOS SOI Polysilicon Transistor", IEEE ELECTRON DEVICE LETTERS, VOL. 11, NO. 8, AUGUST 1990, PP. 349–351, proposed a method for fabricating a polysilicon transistor, in which the gate oxide is formed over the single-crystal silicon substrate, with the substrate acting as the gate electrode.

As illustrated in FIGS. 1a–1d, the method proposed by James R. Pfiester, et al. comprises a first step in which silicon dioxide serving as the gate oxide 11 is thermally grown on the N-type single-crystalline silicon substrate 10. Thereafter, an undoped layer of amorphous silicon thin film is formed by deposition at a temperature of 550° C. The amorphous silicon thin film is then transformed to a polysilicon layer by a 600° C. annealing for 12 hours before the polysilicon layer is implanted with phosphorous ions to form an N⁻-type polysilicon thin film 12, as shown in FIG. 1a. A silicon nitride layer 13 is subsequently deposited on the N⁻-type polysilicon thin film 12. The silicon nitride layer 13 is then coated thereon with a photoresist 14 which is used in forming a patterned silicon nitride layer by photolithography and reactive ion etching. Prior to the stripping of the photoresist 14, a high-energy boron implantation is performed through a naked N⁻-type polysilicon channel and the gate oxide 11 and into the underlying silicon substrate 10 so as to form the P⁺ buried-gate electrode 15, as shown in FIG. 1b.

After the photoresist 14 is stripped, the patterned silicon nitride layer 13 is used as a mask in growing a polysilicon oxide 16 on the naked N⁻-type polysilicon channel region. In the meantime, the polysilicon channel region is made thinner, as shown in FIG. 1C. Upon completion of the stripping of the silicon nitride mask 13, the P⁺-type drain 17 and source 18 regions are formed by using a blanket boron implantation, thereby defining the active regions. This P⁺ implant is prevent from entering the underlying N⁻-type polysilicon channel region due to the presence of the thick polysilicon oxide 16. The P⁺-type drain/source regions 17 and 18 are then annealed at a temperature of 850° C. for 15 minutes, as illustrated in FIG. 1d.

The deposition of a silicon dioxide layer serving as an intermediate insulation and the definition of contact holes and aluminum metallization are carried out by using the conventional CMOS process. Finally, the drain electrode and the source electrode are formed by etching aluminum in conjunction with the photolithography.

The method proposed by James R. Pfiester, et al. as described above is defective in design in that it is more complicated than the conventional methods for fabricating a polysilicon thin film transistor, and that it is therefore not cost-effective.

SUMMARY OF THE INVENTION

It is therefore the primary objective of the present invention to provide an improved method for fabricating a polysilicon transistor having a buried-gate structure. The improved method of the present invention is relatively simple in fabrication by making use of the selective liquid phase deposition in place of the polysilicon oxidation using silicon nitride as a mask proposed by James R. Pfiester, et al.

The improved method of the present invention is superior to the method proposed by James R. Pfiester, et al. in terms of throughput.

The method of the present invention for fabricating a polysilicon transistor having a buried-gate structure comprises the steps of:

(a) forming on an N-type silicon substrate a silicon dioxide layer serving as a gate oxide layer;

(b) forming an N-type polysilicon layer on the gate oxide layer;

(c) forming a patterned photoresist on the N-type polysilicon layer such that a portion of the N-type polysilicon layer is unmasked;

(d) using the patterned photoresist as a mask to perform an P-type dopant implanting through the unmasked N-type polysilicon layer and the gate oxide layer and into a position located under the unmasked N-type polysilicon layer of the underlying N-type silicon substrate so as to form a P-type buried gate;

(e) forming an insulation layer by selective deposition on the unmasked surface of the N-type polysilicon layer;

(f) stripping the patterned photoresist and then using the insulation layer as a mask to perform the P-type doping into the N-type polysilicon layer so as to form a source and a drain; and (g) forming by deposition on the insulation layer and the N-type polysilicon layer an intermediate silicon dioxide insulation layer, and defining contact holes for forming a source electrode and a drain electrode.

The selective deposition of the insulation layer referred to in the step (e) is preferably a selective silicon dioxide liquid phase deposition, which is carried out in an aqueous hydrofluorosilicic acid ($H_2SiF_6$) solution supersaturated with silicon dioxide at a temperature ranging between the room temperature and 55° C. for a period ranging between 0.5 and 50 hours. The aqueous hydrofluorosilicic acid solution supersaturated with silicon dioxide has a 0.5–4.0M hydrofluorosilicic acid concentration and further contains 0–0.64 mol % of boric acid based on the mole of the hydrofluorosilicic acid.

The aqueous hydrofluorosilicic acid solution supersaturated with silicon dioxide is preferably prepared by mixing an aqueous hydrofluorosilicic acid solution saturated with silicon dioxide and water in a volumetric ratio ranging between 4:1 and 2:1. The aqueous hydrofluorosilicic acid solution saturated with silicon dioxide is formed by dissolving an excess amount of silicon dioxide powder in a 0.5–4.0M hydrofluorosilicic acid aqueous solution and removing the undissolved silicon dioxide powder from the solution by filtration.

Alternatively, the aqueous hydrofluorosilicic acid solution supersaturated with silicon dioxide is prepared by mixing 4M hydrofluorosilicic acid aqueous solution with an excess amount of silicon dioxide powder. The undissolved silicon dioxide are removed from the solution by filtration. Thereafter, the filtered hydrofluorosilicic acid aqueous solution saturated with silicon dioxide is mixed with water and 0.1M boric acid aqueous solution in a volumetric ratio ranging between 47.6:2.4:4 and 47.6:2.4:12.

The features and the advantages of the method of the present invention will be more readily understood upon a thoughtful deliberation of the following detailed description of a preferred embodiment of the present invention in conjunction with the accompanying drawings.

DETAILED DESCRIPTION OF THE EMBODIMENT

Figure 1A:
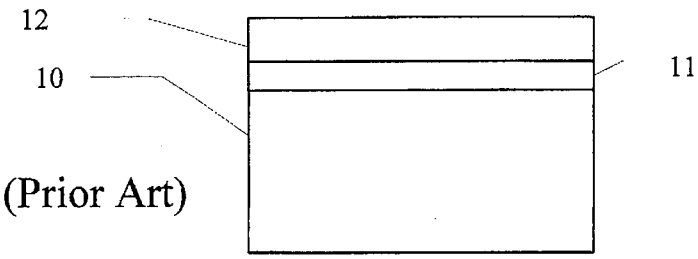
FIGS. 1a–1d are schematic views which illustrate the partial flow diagrams of a prior art method for fabricating a polysilicon transistor having a buried-gate structure.
Figure 1B:
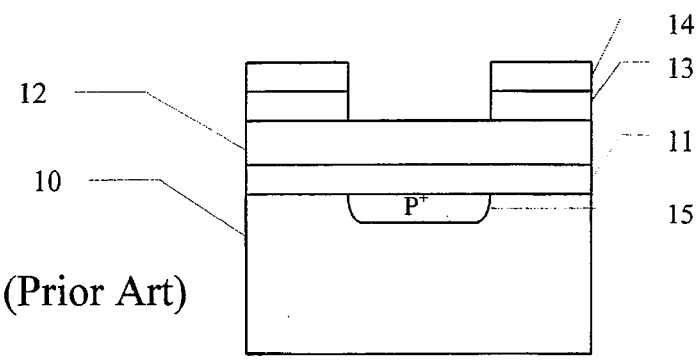
Figure 1C:
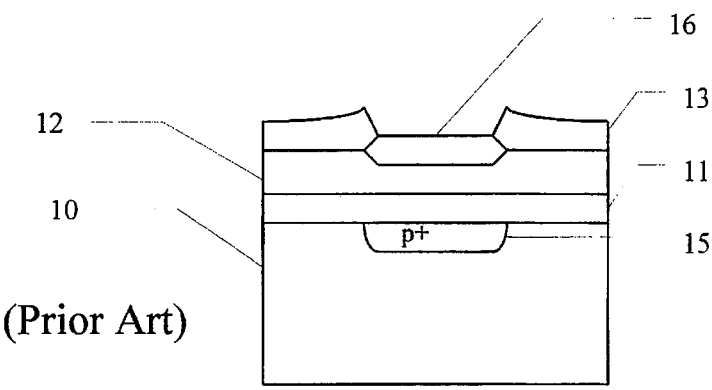
Figure 1D:
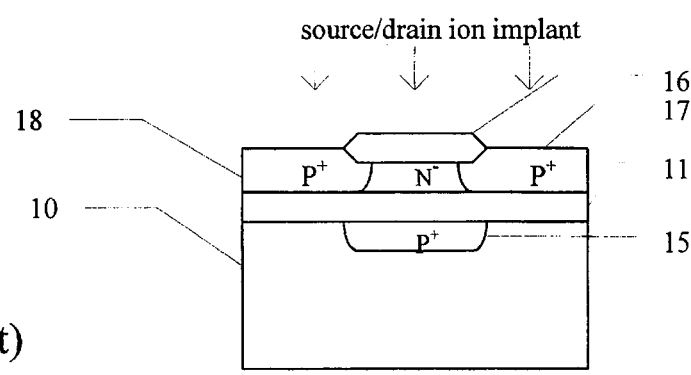
Figure 2A:
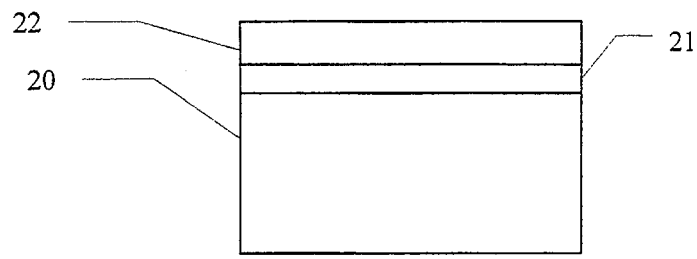
FIGS. 2a–2d are schematic views which illustrate the partial flow diagrams of the method of the present invention for fabricating a polysilicon transistor having a buried-gate structure.

As shown in FIG. 2a, a gate oxide layer 21 is grown thermally on an N-type silicon substrate 20. The gate oxide 21 is formed of silicon dioxide by oxidation or liquid phase deposition performed at the room temperature. The liquid phase deposition is especially suitable for a low-temperature fabrication of the SRAM circuits. An undoped amorphous silicon thin film is then formed by deposition at 550° C. The amorphous silicon grain size is subsequently enlarged by a 600° C. annealing for 12 hours such that the amorphous silicon is transformed to a polysilicon thin film, which is then implanted in a blanket manner with phosphorous ions to become an N⁻-type polysilicon thin film 22.

Figure 2B:
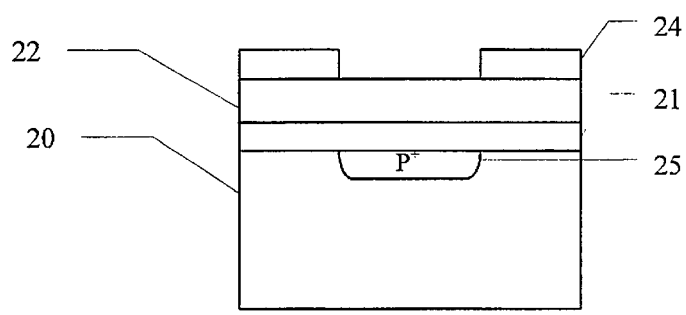

As shown in FIG. 2b, the N-type polysilicon thin film 22 is coated thereon with a photoresist 24, which is then patterned by photolithography. Using the patterned photoresist 24 as a mask, a high-energy boron implant is performed through the unmasked N⁻-type polysilicon channel region and the gate oxide 21 and into the underlying N-type silicon substrate 20 to form a P⁺ buried-gate electrode 25. The unmasked N⁻-type polysilicon channel region can be optionally made thinner by using the patterned photoresist 24 as a mask to perform a reactive ion etching (RIE) on the unmasked N-type polysilicon channel region.

Figure 2C:
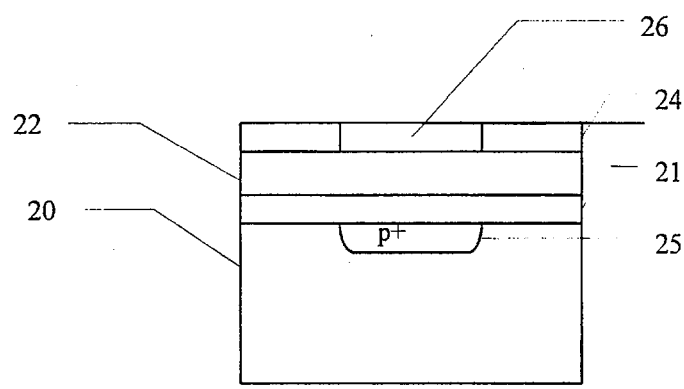
Figure 2D:
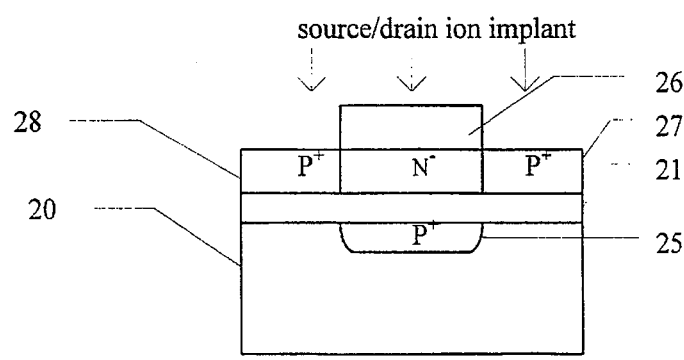

As illustrated in FIG. 2C, a selective liquid phase deposition (LPD) of silicon dioxide is carried out before the patterned photoresist 24 is stripped. The silicon dioxide 26 is selectively deposited on the unmasked N⁻-type polysilicon channel region such that the silicon dioxide 26 is not deposited on the photoresist 24. After the photoresist 24 is stripped completely, the silicon dioxide 26, which is formed selectively by LPD, is used as a mask to perform a blanket boron implantation to form P⁺-type drain region 27 and source region 28, as shown in FIG. 2d. The drain/source regions are then activated by annealing at 850° C. for 15 minutes, and an active region is defined.

By using the conventional CMOS processing, a silicon dioxide layer is deposited on the entire surfaces of the silicon dioxide 26 and the uncovered portion of the N-type polysilicon thin film 22 to serve as an intermediate insulator; contact holes and a blanket aluminum metallization are defined before the drain electrode and the source electrode are formed by a photolithographic etching of aluminum.

The selective silicon dioxide liquid phase deposition of the present invention is carried out by using an aqueous hydrofluorosilicic acid solution supersaturated with silicon dioxide, which is prepared by dissolving 35 grams of the silicon dioxide powder having 99.99% purity in one liter of 4M hydrofluorosilicic acid ($H_2SiF_6$) aqueous solution. The mixture is agitated at room temperature for 17 hours such that the hydrofluorosilicic acid water solution is saturated with silicon dioxide. The undissolved silicon dioxide powder are removed from the saturated solution by a 0.1 μm filter. 400 ml of the resulting hydrofluorosilicic acid aqueous solution saturated with silicon dioxide is mixed with 100 ml of water to form the aqueous hydrofluorosilicic acid solution supersaturated with silicon dioxide as a deposition solution. The N-type silicon substrate 20 having the patterned photoresist 24, as shown in FIG. 2b, is completely impregnated in the deposition solution at 35° C. for 7 hours such that the silicon dioxide layer 26 having a thickness of 5000 Å is deposited selectively on the unmasked N-type polysilicon channel region.

It is therefore readily apparent that the method of the present invention is simplified to an extent that the throughput of the present invention is greatly improved and that the method of the present invention can be carried out at a relatively low temperature.

The embodiment of the present invention described above is to be regarded in all respects as being merely illustrative and not restrictive. Accordingly, the present invention may be embodied in other specific forms without deviating from the spirit thereof. The present invention is therefore to be limited only by the scopes of the following appended claims.

What is claimed is:

1. A method for fabricating a polysilicon transistor having a buried-gate structure, said method comprising the steps of:
    (a) forming on an N-type silicon substrate a silicon dioxide layer serving as a gate oxide layer;
    (b) forming an N-type polysilicon layer on the gate oxide layer;
    (c) forming a patterned photoresist on the N-type polysilicon layer such that a portion of the N-type polysilicon layer is unmasked;
    (d) using the patterned photoresist as a mask to perform an P-type dopant implanting through the unmasked N-type polysilicon layer and the gate oxide layer and into a position located under the unmasked N-type polysilicon layer of the underlying N-type silicon substrate so as to form a P-type buried gate;
    (e) forming an insulation layer by selective deposition on the unmasked surface of the N-type polysilicon layer;
    (f) stripping the patterned photoresist and then using the insulation layer as a mask to perform the P-type doping into the N-type polysilicon layer so as to form a source and a drain; and
    (g) forming by deposition on the insulation layer and the N-type polysilicon layer an intermediate silicon dioxide insulation layer, and defining contact holes for forming a source electrode and a drain electrode.

2. The method as defined in claim 1, wherein said selective deposition of said insulation layer referred to in the step (e) is a selective silicon dioxide liquid phase deposition.

3. The method as defined in claim 2, wherein said selective silicon dioxide liquid phase deposition is carried out in an aqueous hydrofluorosilicic acid ($H_2SiF_6$) solution supersaturated with silicon dioxide at a temperature ranging between the room temperature and 55° C. for a period ranging between 0.5 and 50 hours, wherein said aqueous hydrofluorosilicic acid solution supersaturated with silicon dioxide has a 0.5–4.0M hydrofluorosilicic acid concentration and further contains 0–0.64 mol % of boric acid based on the mole of the hydrofluorosilicic acid.

4. The method as defined in claim 3, wherein said aqueous hydrofluorosilicic acid solution supersaturated with silicon dioxide is prepared by mixing an aqueous hydrofluorosilicic acid solution saturated with silicon dioxide and water in a volumetric ratio ranging between 4:1 and 2:1, wherein said aqueous hydrofluorosilicic acid solution saturated with silicon dioxide is formed by dissolving an excess amount of silicon dioxide powder in a 0.5–4.0M hydrofluorosilicic acid aqueous solution and removing the undissolved silicon dioxide powder from the solution by filtration.

5. The method as defined in claim 3, wherein said aqueous hydrofluorosilicic acid solution supersaturated with silicon dioxide is prepared by mixing 4M hydrofluorosilicic acid aqueous solution with an excess amount of silicon dioxide powder; removing undissolved silicon dioxide from the solution by filtration; and the filtered hydrofluorosilicic acid aqueous solution saturated with silicon dioxide is mixed with water and 0.1M boric acid aqueous solution in a volumetric ratio of the filtered hydrofluorosilicic acid aqueous solution saturated with silicon dioxide: water: 0.1M boric acid aqueous solution ranging between 47.6:2.4:4 and 47.6:2.4:12.

* * * * *